US007381110B1

(12) United States Patent
Sampica et al.

(10) Patent No.: US 7,381,110 B1
(45) Date of Patent: Jun. 3, 2008

(54) PROCESS FOR APPLYING A PROTECTIVE COVER ON AN ORGANIC LIGHT-EMITTING DIODE USING A LIQUID ADHESIVE

(75) Inventors: James D. Sampica, Springville, IA (US); Paul R. Nemeth, Cedar Rapids, IA (US); Vincent P. Marzen, Robins, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 98 days.

(21) Appl. No.: 11/215,050

(22) Filed: Aug. 30, 2005

(51) Int. Cl.
*H01L 21/00* (2006.01)
(52) U.S. Cl. .......................... 445/24; 445/25; 313/512
(58) Field of Classification Search ............... 313/512, 313/506, 511; 445/23, 24, 25; 438/118, 438/26; 156/295, 358
See application file for complete search history.

(56) References Cited

U.S. PATENT DOCUMENTS

| 5,592,288 | A | 1/1997 | Sampica et al. ............ 356/62 |
| 6,614,057 | B2* | 9/2003 | Silvernail et al. ............ 257/99 |
| 6,803,245 | B2* | 10/2004 | Auch et al. ............... 438/26 |
| 6,984,545 | B2* | 1/2006 | Grigg et al. ............... 438/118 |
| 6,998,648 | B2* | 2/2006 | Silvernail .................. 257/99 |

OTHER PUBLICATIONS

U.S. Patent Application No. , "OLED Face Seal Incorporating Liquid Adhesive And Cover Glass," Vincent Marzen et al.
U.S. Patent Application No. , "Process for Glass-to-Glass Sealing OLEDs With Dry Film Adhesive," James Sampica et al.
U.S. Patent Application No. , "Panel-To-Panel Lamination Method For Improved Uniformity," Vincent Marzen et al.

* cited by examiner

*Primary Examiner*—Anabel M Ton
(74) *Attorney, Agent, or Firm*—Nathan O. Jensen; Kyle Eppele

(57) ABSTRACT

A method of sealing an Organic Light-Emitting Diode (OLED) assembly is disclosed. According to the method, a liquid adhesive is applied to substantially all of a surface of an OLED assembly. A region of increased thickness of liquid adhesive is formed adjacent to a first edge of the OLED assembly. A first edge of the protective cover is placed adjacent to the first edge of the OLED assembly. A second edge of the protective cover is moved toward a second edge of the OLED assembly such that the region of increased thickness of liquid adhesive is moved from being adjacent to the first edge of the OLED assembly to being adjacent to the second edge of the OLED assembly. The liquid adhesive is allowed to stabilize and is then cured.

17 Claims, 7 Drawing Sheets

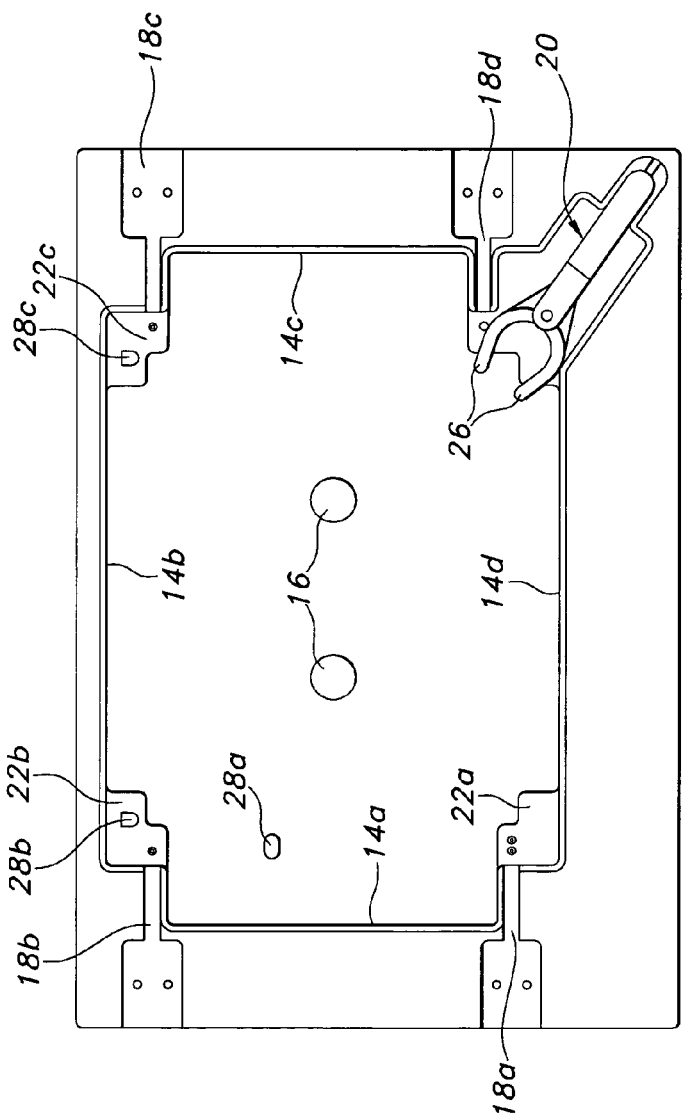
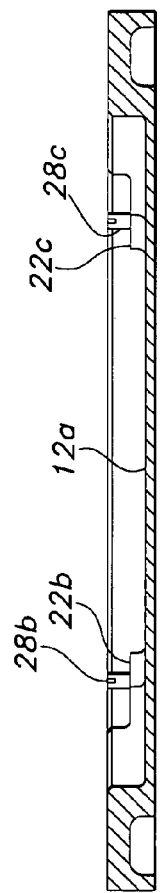
FIG. 2
FIG. 3

PROCESS FOR APPLYING A PROTECTIVE COVER ON AN ORGANIC LIGHT-EMITTING DIODE USING A LIQUID ADHESIVE

RELATED INVENTIONS

This application is related to the following co-pending U.S. Patent Applications, all of which are filed on an even date herewith and are incorporated by reference herein in their entirety:

U.S. patent application Ser. No. 11/214,547, "OLED Face Seal Incorporating Liquid Adhesive And Cover Glass," Vincent Marzen et al.;

U.S. patent application Ser. No. 11/214,518, "Process for Glass-to-Glass Sealing OLEDs With Dry Film Adhesive," James Sampica et al.; and U.S. patent application Ser. No. 11/215,683, "Panel-To-Panel Lamination Method For Improved Uniformity," Vincent Marzen et al.

FIELD OF THE INVENTION

The invention relates to displays, and more particularly, to the manufacture of organic light-emitting diode (OLED) displays.

BACKGROUND OF THE INVENTION

Organic light-emitting diodes (OLED) displays are light-emitting diodes that incorporate semiconducting organic polymers. OLEDs are beginning to penetrate new markets and are used in many different applications as OLED technology matures. However, because the organic materials used in OLED technology are sensitive to oxygen and humidity, these materials must be sealed to prevent penetration by air or water. One solution has been to adhere a capping or protective layer such as a sheet of glass upon the OLED materials by sealing the perimeter of the combined OLED/glass assembly with a moisture-proof edge seal. However, known processes do not provide an effective seal between the capping layer and the OLED materials. Known bonding processes often result in bubbles and defects in the adhesive interface or in the OLED layer itself. What is needed is a reliable method of adhering a protective layer to an OLED assembly.

It is therefore an object of the invention to provide a reliable method of adhering a protective layer to an OLED assembly.

A feature of the invention is adhering a protective layer to an OLED assembly using a liquid adhesive.

An advantage of the invention is improved isolation of the OLED.

SUMMARY OF THE INVENTION

The invention provides a method of sealing an Organic Light-Emitting Diode (OLED) assembly. According to the method, a liquid adhesive is applied to substantially all of a surface of an OLED assembly. A region of increased thickness is formed adjacent to a first edge of the OLED assembly. A first edge of the protective cover is placed adjacent to the first edge of the OLED assembly. A second edge of the protective cover is moved toward a second edge of the OLED assembly such that the region of increased thickness of liquid adhesive is moved from being adjacent to the first edge of the OLED assembly to being adjacent to the second edge of the OLED assembly. The liquid adhesive is then cured.

The invention also provides a method of adhering a substantially transparent protective cover to an organic light-emitting diode (OLED) assembly. According to the method, a liquid adhesive is applied to substantially all of a face of one of the OLED assembly and the protective cover. A region of increased thickness of liquid adhesive is formed adjacent to a first edge of said one of the OLED assembly and protective cover. A first edge of the other of the OLED assembly and protective cover is placed adjacent to the first edge of said one of the OLED assembly and protective cover. A second edge of the other of the OLED assembly and protective cover is moved toward a second edge of said one of the OLED assembly and protective cover such that the region of increased thickness of liquid adhesive is moved from being adjacent to the first edge of said one of the OLED assembly and protective cover to being adjacent the second edge of said one of the OLED assembly and protective cover. The OLED assembly and the protective cover are abutted against an alignment structure. The liquid adhesive is cured.

The invention further provides an organic light-emitting diode (OLED) assembly, including an OLED layer disposed upon a substrate. A substantially transparent protective cover is configured to contact the OLED layer to thereby protect the OLED layer. A liquid adhesive is applied to substantially all of a face of the OLED layer. The protective cover placed upon the OLED layer by forming a region of increased thickness of liquid adhesive adjacent to a first edge of the OLED layer, positioning a first edge of the protective cover adjacent to the first edge of the OLED layer, moving a second edge of the protective cover toward a second edge of the OLED layer so that the region of increased thickness of liquid adhesive is moved from being adjacent to the first edge of the OLED layer to being adjacent to the second edge of the OLED layer, abutting the substrate and the protective cover against an alignment structure, and stabilizing and curing the liquid adhesive while the substrate is placed upon a plurality of support members.

BRIEF DESCRIPTION OF THE DRAWINGS

FIG. 2 is a top plan view of the fixture shown in FIG. 1.

FIG. 3 is a sectional view taken along the line 3-3 in FIG. 1.

DETAILED DESCRIPTION OF THE DRAWINGS

Figure 1:
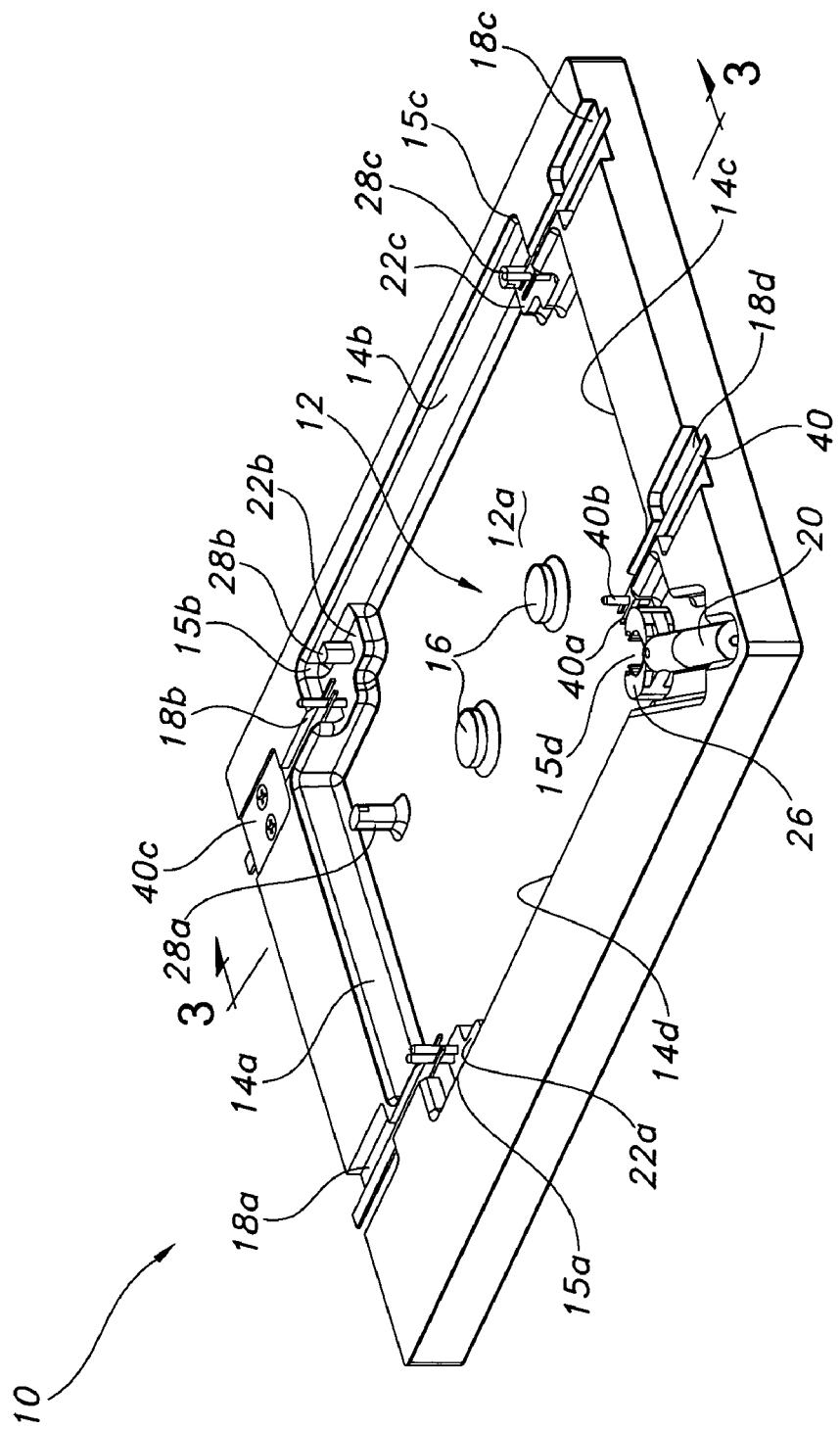
FIG. 1 is a perspective view of a fixture used with the invention.
Figure 4:
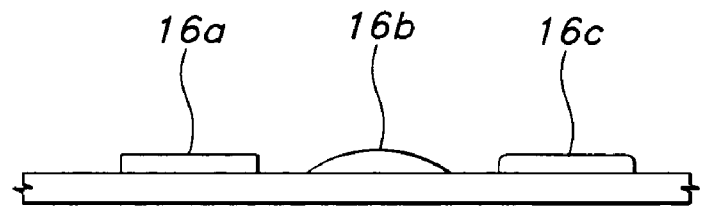
FIG. 4 is a side elevational view of support elements according to the invention.

Describing now the invention with reference to FIGS. 1-7, the invention provides a reliable method of applying a protective cover to an OLED assembly. It should be noted that the drawings are not necessarily drawn to scale, and that the dimensions of the various disclosed components have been drawn for the purposes of clarity in understanding the invention. A manufacturing fixture 10 used with the invented process is shown in FIGS. 1-4. Fixture 10 includes a recessed portion or cavity 12 having dimensions at least as great as the OLED assembly to which a protective cover is to be attached. The recessed portion is defined by a floor 12a surrounded by first through fourth walls 14a, 14b, 14c, and 14d. A plurality of support members, contact points, posts or pedestals 16 are attached to or manufactured as part of floor 12a. Pedestals 16 may have a cylindrical cross-section and, as shown in FIG. 4 may have tops that are flat 16a, rounded (spherical) 16b, or beveled 16c. A shim recess 18a, 18b, 18c, 18d is disposed adjacent each corner 15a, 15b, 15c, 15d of cavity 12. Each shim recess is configured to permit a shim 40 to be latitudinally supported when placed between an OLED assembly and a protective cover, as will be described below. As shown in FIG. 1, each shim 40 has a forked tip 40a configured to be inserted between the OLED assembly and the protective cover. Movement of the shim into the fixture is limited by a shim post 40b that is mounted in the fixture. A shim recess cover 40c may be placed over each shim recess.

An actuating element 20 is mounted at or near corner 15d. Actuating element 18 has a contacting portion 26 that is designed to contact an OLED assembly and/or a protective cover attached to an OLED assembly, as will be explained herein. The actuating element is preferably urged or biased to move toward the center of cavity 12 by means of a spring (not shown) or the like. An intermediate surface 22a, 22b, 22c is shown at corners 15a, 15b, 15c. Each intermediate surface supports a corner of the OLED assembly while the OLED assembly is in the fixture 10. Intermediate surfaces 22a, 22b, 22c are the same height above cavity floor 12a as the tops of pedestals 16. A first alignment post 28a is disposed upon cavity floor 12a adjacent first wall 14a. Second and third alignment posts 28b, 28c are situated near corners 15b, 15c, respectively. The alignment posts provide a datum by which to align the OLED assembly and the protective cover as explained below.

Figure 5:
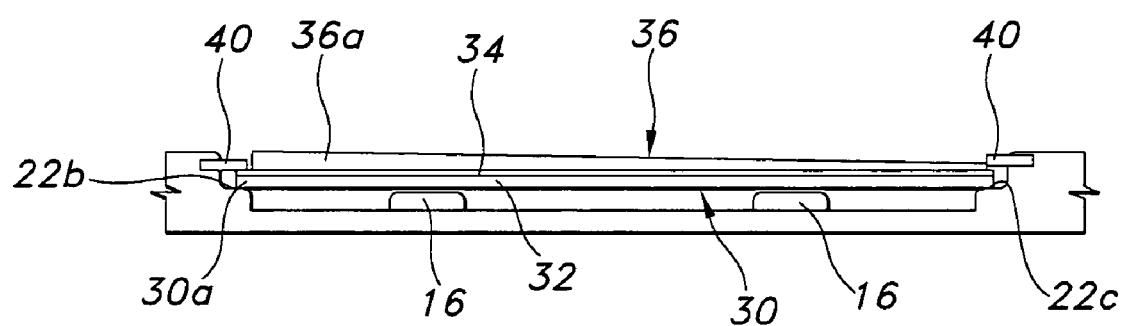
FIG. 5 is a side elevational view of an OLED assembly during a manufacturing step according to the invention.
Figure 6:
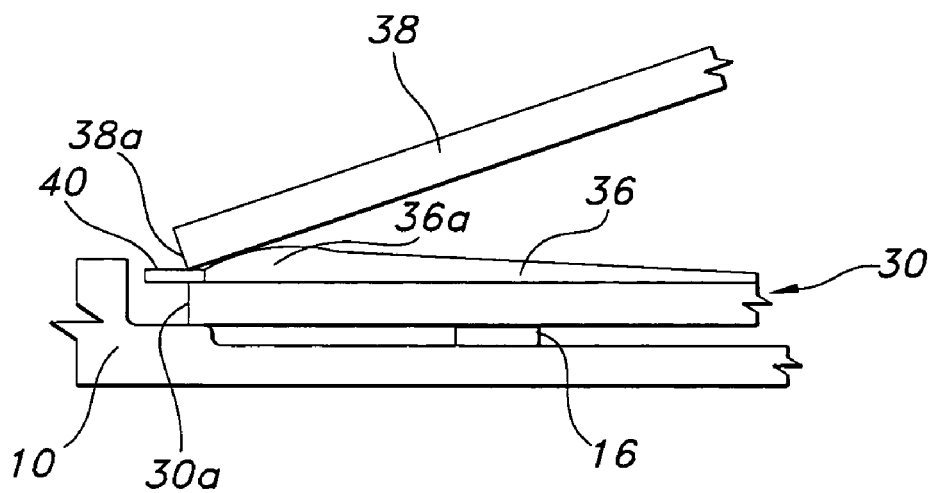
FIG. 6 is a side elevational view of the OLED assembly and a protective cover during another manufacturing step according to the invention.
Figure 7:
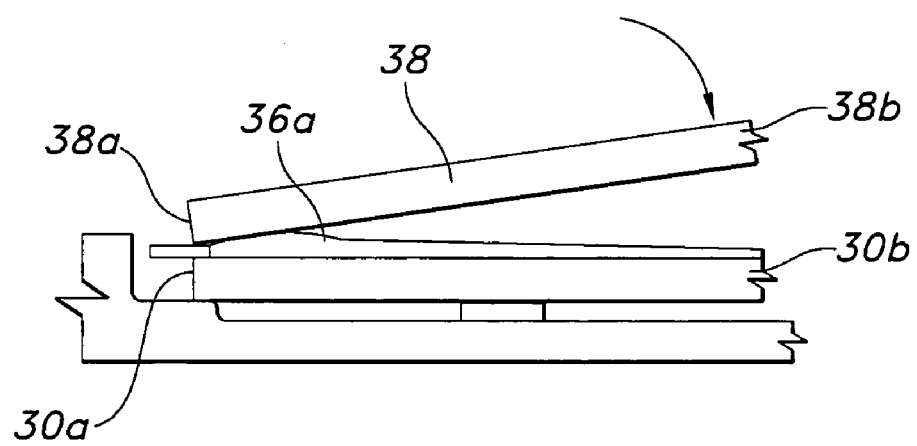
FIG. 7 is a side elevational view of the OLED assembly and the protective cover during still another manufacturing step according to the invention.

FIG. 5 shows an OLED assembly 30 according to the invention. OLED assembly 30 includes a back pane or substrate 32, which may be glass, stainless steel, or other suitable material. OLED materials 34 are disposed upon substrate 32 using any suitable manufacturing method. According to the invention, OLED assembly 30 is placed into recessed portion 12 of fixture 10. Specifically, the OLED assembly is placed upon pedestals 16 and intermediate surfaces 22a, 22b, 22c so that the OLED assembly does not contact floor 12a. Shims 40 are inserted via shim recesses 18a, 18b, 18c, 18d to contact the corners of the OLED assembly. A transparent liquid adhesive 36 is dispensed upon OLED materials 34 such that all or substantially all of the OLED materials are covered by the liquid adhesive. An exemplary type of liquid adhesive usable with the invention is known as XE-5844 and is manufactured by General Electric Company of Fairfield, Conn., although other liquid adhesives may alternatively be used. As shown in FIG. 5, the liquid adhesive is dispensed such that a region 36a of increased thickness of adhesive is created above a first edge 30a of the OLED assembly. Region 36a can be defined as a line or bead of liquid adhesive having a thickness that is greater than other portions of the applied liquid adhesive. Once region 36a is of suitable thickness, a protective glass cover 38 is placed upon the application of liquid adhesive 36 as shown in FIG. 7. Specifically, a first edge 38a of the protective cover is placed to contact first edge 30a of the OLED assembly 30. A second edge 38b of protective cover 38 is then slowly brought closer to a second edge 30b of the OLED assembly (FIG. 7). Such movement causes region 36a to gradually move from adjacent first edges 30a, 38a to adjacent second edges 30b, 38b. Region 36a provides a sufficient amount of adhesive at the point of contact between the protective cover and the adhesive to discourage the formation of air bubbles within the adhesive. If the second edges 38b, 30b are brought together too quickly, region 36a will disappear and air bubbles are more likely to be trapped within the adhesive. On the other hand, if the second edges are brought together too slowly or if fixture is tilted at too steep an angle, too much adhesive 36 will move toward the first edges 30a, 38a and may not be available for bonding. Therefore, the rate at which second edges 38a and 30a are brought together should be slow enough to ensure a bead of adhesive is maintained. Shims 40 prevent liquid adhesive 36 from being excessively pressed from between the OLED assembly and the protective cover as the second edges are brought adjacent each other. Shims 40 further ensure the liquid adhesive 36 cures at a constant thickness. Excess liquid adhesive that has flowed out from between the OLED assembly and the protective cover may be wiped off the edges of the OLED assembly, or alternatively may be simply permitted to drip onto floor 12a of recessed portion 12. Pedestals 16 and intermediate surfaces 22a, 22b, 22c prevent capillary action or wicking of excess liquid adhesive beneath the OLED substrate 32 if the OLED substrate were otherwise placed directly upon floor 12a. Such wicking may create undesirable effects to the bondline of the liquid adhesive.

Figure 8:
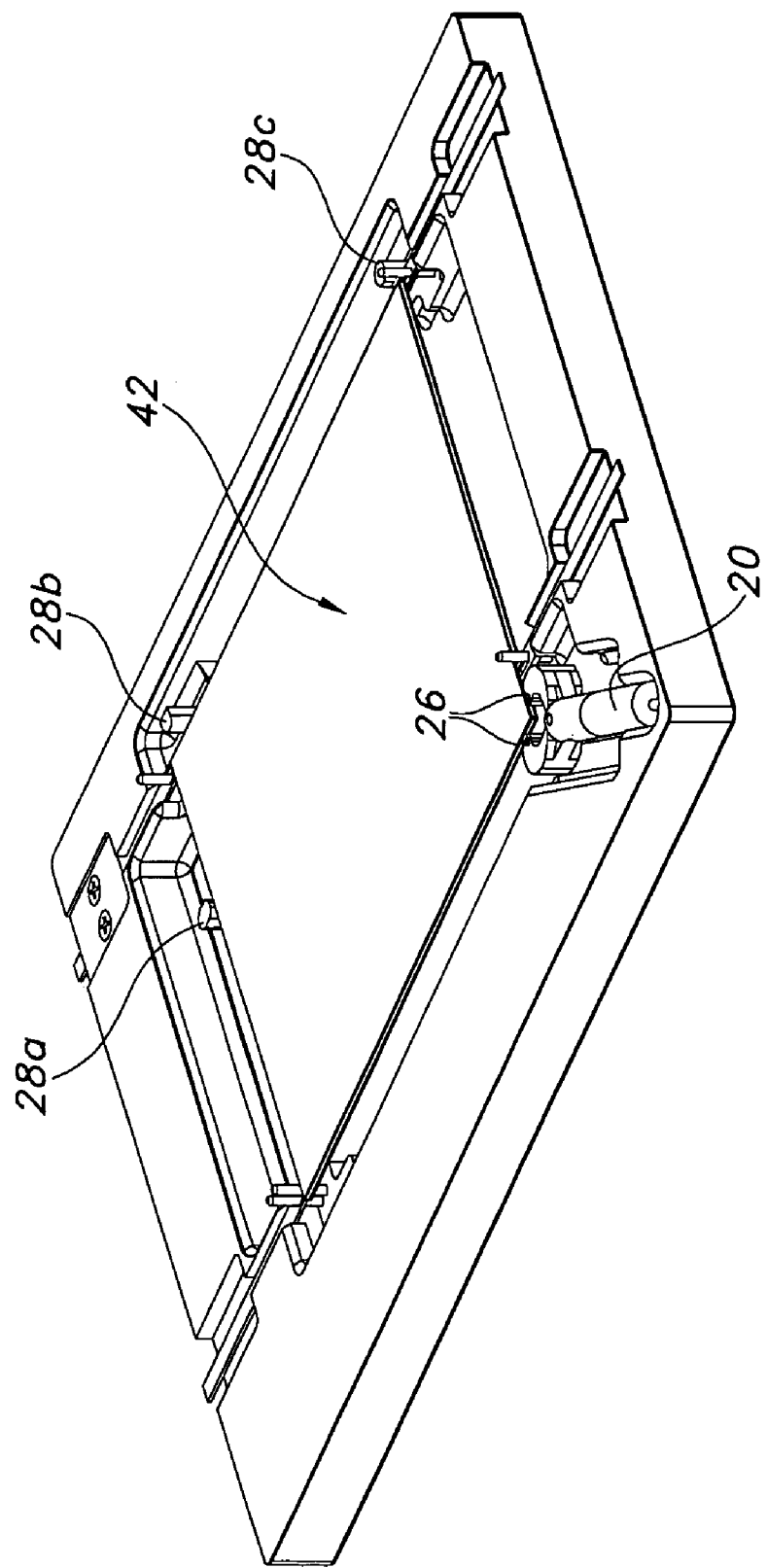
FIG. 8 is a perspective view of another manufacturing step according to the invention.

Actuating element 20 is moved to cause contacting portion 26 to contact adjacent edges of the combined OLED assembly/protective cover 42 (FIG. 8). Actuating element 20 is further moved such that combined OLED assembly/ protective cover 42 is moved across pedestals 16 until the edges of the OLED assembly and protective cover contact or abut first, second and third alignment posts 28a, 28b, 28c. The alignment posts serve as an alignment structure to ensure the OLED assembly and the protective cover are properly aligned with each other. The OLED assembly and the protective cover are maintained in this position for a sufficient amount of time for liquid adhesive 36 to stabilize, and the liquid adhesive is then cured according to the curing requirements of the adhesive, which may include a slight weight applied to protective cover 38, exposure to ultraviolet (UV) radiation, increased temperature, or the like. Once sufficiently cured, the temporary shims are removed and the combined OLED assembly and protective cover are removed from the fixture.

Figure 9:
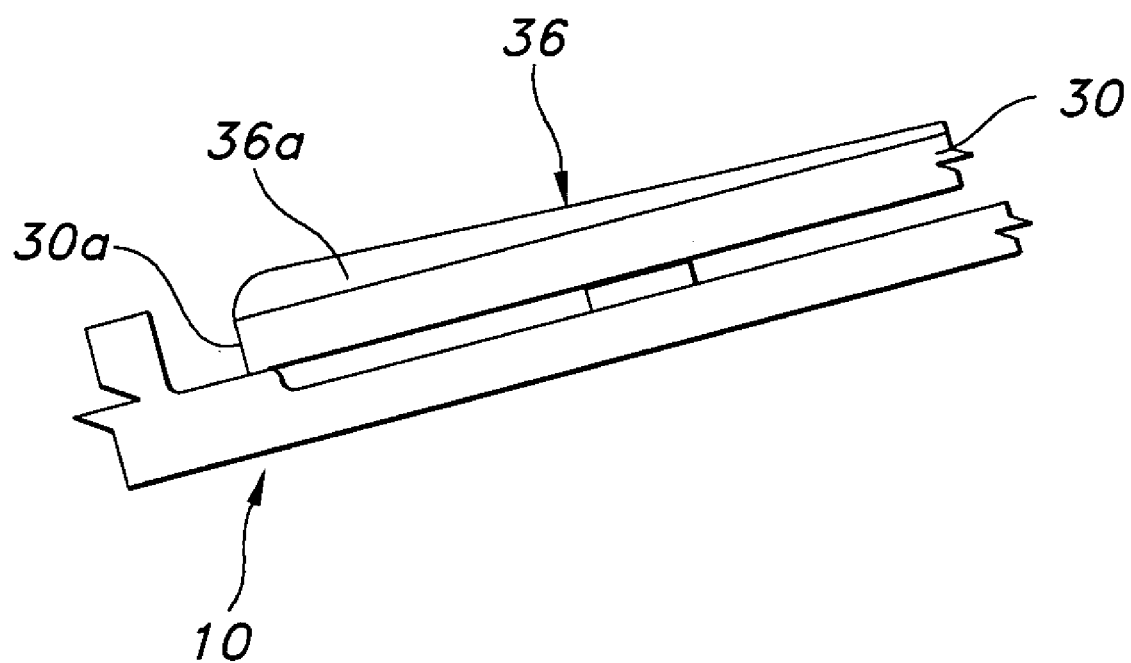
FIG. 9 is a side elevational view of an OLED assembly according to another embodiment of the invention.

FIG. 9 shows another embodiment of the invention in which region 36a is formed by tilting fixture 10 so that liquid adhesive 36 migrates toward first edge 30a of OLED assembly 30. In some circumstances tilting the fixture may provide a more acceptable region 36a of increased thickness of the liquid adhesive.

Figure 10:
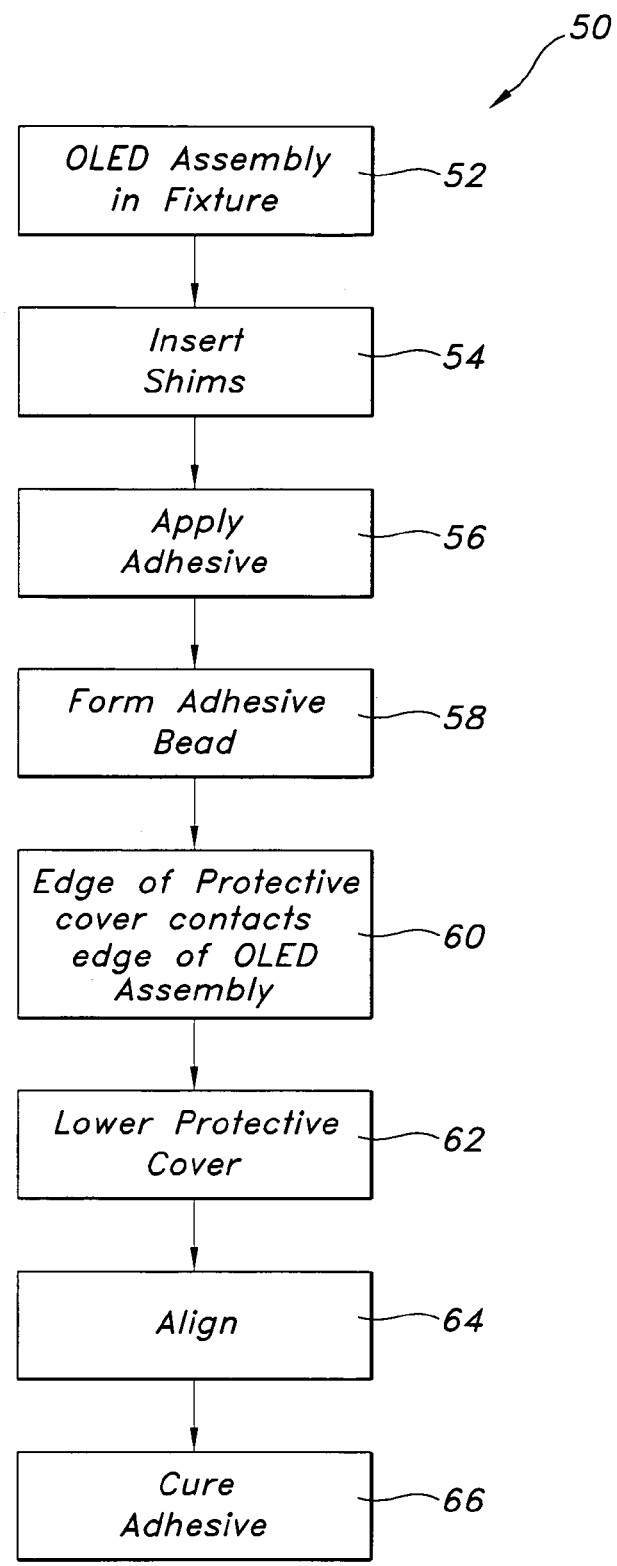
FIG. 10 is a flowchart of a method according to the invention.

FIG. 10 depicts a method 50 of the invention in flowchart form. It should be noted that the steps of the invention as disclosed in FIG. 10 are not exclusive; more steps may be added as disclosed herein. Furthermore, the steps disclosed in FIG. 10 are not strictly order-specific and may be performed in various sequences as desired while keeping with the spirit of the disclosed invention. According to method 50, at 52 an OLED assembly is placed upon a plurality of support members in a fixture. In step 54 shims or other temporary spacers are placed along the edges or corners of the OLED assembly to maintain a constant adhesive thickness. In step 56 a liquid adhesive is applied to a surface of the OLED assembly. In step 58 a bead or region of increased thickness of liquid adhesive is created. This may be accomplished by dispensing additional liquid adhesive along a first edge of the OLED assembly, or alternatively the fixture and/or the OLED assembly may be tilted so that the liquid adhesive migrates toward the first edge of the OLED assembly. In step 60 a first edge of the protective cover is placed upon or adjacent the first edge of the OLED assembly. In step 62 the protective cover is lowered or rotated such that the bead of liquid adhesive is gradually moved away from the first edge of the OLED assembly and toward an opposite edge of the OLED assembly. In step 64 the OLED assembly and the protective cover are abutted against an alignment structure, which in the disclosed embodiments is a plurality of alignment posts. In step 66 the liquid adhesive is permitted to stabilize and is then cured, and the temporary shims are then removed.

The invention has been described as placing an OLED assembly in a fixture and lowering or dropping a protective cover onto the OLED assembly. However, the scope of the invention is broad enough to contemplate placing a protective cover in the fixture and lowering or dropping the OLED assembly thereupon. Such a reversal of parts can be done without significant variation to the remainder of the invented process.

The invention may be varied in many ways while maintaining the spirit of the invention. For example, substrate 32 may be made of a flexible material. If so, extra measures may be required to immobilize OLED assembly 30 during the manufacturing process. The alignment posts may be removable or may alternatively be constructed as an integral part of nearby walls 14a, 14b, 14c. Also, protective cover 38 may be made of any transparent, stiff material such as plastic. Additionally, a lid (not shown) may be used with the fixture as a weight to assist with bondline control by urging the protective cover to contact the shims. Finally, pedestals 16 may have other shapes and/or cross-sections, and the tops of the pedestals may be coated with a low-friction or non-abrasive substance to prevent damage to the substrate 32. The number of pedestals may be varied as desired.

The invention as disclosed herein provides a method of bonding a protective cover to an OLED assembly using a liquid adhesive. Applying the principles of the disclosed invention permits a protective adhesive bond to be applied while reducing the likelihood of manufacturing defects such as bubbles.

Another advantage is that urging the combined OLED assembly and protective cover against third and fourth walls 14c, 14d during the curing process ensures proper alignment of the OLED assembly and the protective cover. If other components are applied to the combined OLED assembly and/or the protective cover, such as light leak masking, such other components are likewise maintained in alignment while the liquid adhesive is cured.

Still another advantage of the invention is that the liquid adhesive provides especially effective protection to the OLED materials against air and humidity.

While the invention has been disclosed in its preferred form, the specific embodiments thereof as disclosed and illustrated herein are not to be considered in a limiting sense as numerous variations are possible. The subject matter of the invention includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the invention of the present disclosure.

What is claimed is:

1. A method of sealing an Organic Light-Emitting Diode (OLED) assembly, comprising:
   applying a liquid adhesive to substantially all of a surface of an OLED assembly;
   forming a region of increased thickness of liquid adhesive adjacent to a first edge of the OLED assembly;
   placing a first edge of the protective cover adjacent to the first edge of the OLED assembly;
   moving a second edge of the protective cover toward a second edge of the OLED assembly such that the region of increased thickness of liquid adhesive is moved from being adjacent to the first edge of the OLED assembly to being adjacent to the second edge of the OLED assembly;
   moving the OLED assembly and the protective cover against an alignment structure using an actuating mechanism, wherein the alignment structure is configured to contact two non-parallel edges of the OLED assembly; and
   curing the liquid adhesive.

2. The method of claim 1, further comprising:
   placing the OLED assembly upon a plurality of support members prior to applying the liquid adhesive thereto, and maintaining the OLED assembly upon the plurality of support members until the liquid adhesive has been cured.

3. The method of claim 2, wherein the plurality of support members are disposed within a fixture, the fixture including the alignment structure against which at least one edge of the OLED assembly is urged prior to curing the liquid adhesive, said one edge being maintained against the alignment structure until the liquid adhesive has been cured.

4. The method of claim 1, further comprising:
   employing a plurality of contact points to support the OLED assembly while the liquid adhesive is applied thereto and when the liquid adhesive is being cured.

5. The method of claim 1, further comprising:
   maintaining a constant distance between the OLED assembly and the protective cover while the liquid adhesive is being cured.

6. The method of claim 5, wherein the constant distance is maintained by inserting a plurality of spacers between the OLED assembly and the protective cover prior to applying the liquid adhesive to the OLED assembly.

7. The method of claim 1, further comprising:
abutting the OLED assembly and the protective cover against the alignment structure prior to curing the liquid adhesive, wherein the OLED assembly and the protective cover are maintained against the alignment structure until the liquid adhesive is cured.

8. The method of claim 1, wherein the actuating mechanism contacts edges of the OLED assembly not contacted by the alignment structure.

9. The method of claim 1, further comprising:
maintaining a separation between the first edge of the protective cover and the first edge of the OLED assembly while the second edge of the protective cover is moved toward the second edge of the OLED assembly, wherein liquid adhesive is permitted to remain therebetween.

10. A method of adhering a substantially transparent protective cover to an organic light-emitting diode (OLED) assembly, comprising:
applying a liquid adhesive to substantially all of a face of one of the OLED assembly and the protective cover;
forming a region of increased thickness of liquid adhesive adjacent to a first edge of said one of the OLED assembly and protective cover;
placing a first edge of the other of the OLED assembly and protective cover adjacent to the first edge of said one of the OLED assembly and protective cover;
moving a second edge of the other of the OLED assembly and protective cover toward a second edge of said one of the OLED assembly and protective cover such that the region of increased thickness of liquid adhesive is moved from being adjacent to the first edge of said one of the OLED assembly and protective cover to being adjacent to the second edge of said one of the OLED assembly and protective cover;
abutting the OLED assembly and the protective cover against an alignment structure;
urging the OLED assembly and the protective cover against the alignment structure using an actuating mechanism, wherein the alignment structure is configured to contact two non-parallel edges of at least one of the OLED assembly and the protective cover; and
curing the liquid adhesive.

11. The method of claim 10, wherein the alignment structure is part of a fixture that includes a plurality of support members upon which said one of the OLED assembly and protective cover is placed prior to applying the liquid adhesive thereto and maintained thereon until the liquid adhesive is cured.

12. The method of claim 10, further comprising:
maintaining a separation between the first edge of the protective cover and the first edge of the OLED assembly while the second edge of the other of OLED assembly and protective cover is moved toward the second edge of said one of the OLED assembly and protective cover so that liquid adhesive is permitted to remain between the OLED assembly and the protective cover.

13. The method of claim 12, further comprising:
maintaining a constant distance between the OLED assembly and the protective cover while the liquid adhesive is being cured.

14. The method of claim 13, wherein the constant distance is maintained by inserting a plurality of spacers between the OLED assembly and the protective cover prior to applying the liquid adhesive to the OLED assembly.

15. The method of claim 10, wherein the region of increased thickness of liquid adhesive is formed by tilting said one of the OLED assembly and protective cover so that the second edge of said one of the OLED assembly and protective cover is higher than the first edge of said one of the OLED assembly and protective cover.

16. An organic light-emitting diode (OLED) assembly, comprising:
an OLED layer disposed upon a substrate;
a substantially transparent protective cover configured to contact the OLED layer to thereby protect the OLED layer;
a liquid adhesive applied to substantially all of a face of the OLED layer, the protective cover placed upon the OLED layer by forming a region of increased thickness of liquid adhesive adjacent to a first edge of the OLED layer, positioning a first edge of the protective cover adjacent to the first edge of the OLED layer, moving a second edge of the protective cover toward a second edge of the OLED layer so that the region of increased thickness of liquid adhesive is moved from being adjacent to the first edge of the OLED layer to being adjacent to the second edge of the OLED layer, abutting the substrate and the protective cover against an alignment structure using an actuating mechanism, wherein the alignment structure is configured to contact two non-parallel edges of the OLED layer and the protective cover, and stabilizing and curing the liquid adhesive while the substrate is placed upon a plurality of support members.

17. The OLED assembly of claim 16, wherein the protective cover is made of glass.

* * * * *